United States Patent [19]

Hull et al.

[11] Patent Number: 5,234,636
[45] Date of Patent: Aug. 10, 1993

[54] METHODS OF COATING STEREOLITHOGRAPHIC PARTS

[75] Inventors: Charles W. Hull, Santa Clarita; Richard N. Leyden, Topanga Canyon; Marek Sekowski, Sherman Oaks, all of Calif.

[73] Assignee: 3D Systems, Inc., Valenica, Calif.

[21] Appl. No.: 929,463

[22] Filed: Aug. 13, 1992

Related U.S. Application Data

[63] Continuation of Ser. No. 415,168, Sep. 29, 1989, abandoned.

[51] Int. Cl.⁵ .................. B05D 3/06; B29C 35/08; B29C 41/08
[52] U.S. Cl. .................. 264/22; 264/24; 264/129; 264/131; 264/236; 264/255; 264/308; 427/180; 427/386; 427/393.5; 427/475; 427/508; 427/553
[58] Field of Search ............ 264/22, 24, 129, 131, 264/221, 236, 250, 255, 298, 308, 317, 347, DIG. 44; 427/180, 385.5, 386.393, 5.475, 508, 553; 164/34, 35, 45

[56] References Cited

U.S. PATENT DOCUMENTS

| | | | |
|---|---|---|---|
| 2,395,675 | 2/1946 | Luth | 264/347 X |
| 3,717,914 | 2/1973 | Baird et al. | 428/626 |
| 4,364,879 | 12/1982 | Gut et al. | 264/22 |
| 4,427,713 | 1/1984 | White et al. | 427/385.5 X |
| 4,575,330 | 3/1986 | Hull | 264/22 X |
| 4,681,712 | 7/1987 | Sakakibara et al. | 264/24 |
| 4,844,144 | 7/1989 | Murphy et al. | 164/35 |
| 4,908,225 | 3/1990 | Niimura et al. | 427/25 |
| 4,929,403 | 5/1990 | Audsley | 264/22 |

FOREIGN PATENT DOCUMENTS 933250  8/1963  United Kingdom ............ 427/25

OTHER PUBLICATIONS

Abstract of Japan 61-247742 (Published Nov. 5, 1986).

Primary Examiner—Leo B. Tentoni
Attorney, Agent, or Firm—Lyon & Lyon

[57] ABSTRACT

Methods of coating stereolithographic parts and smoothing over characteristic surface discontinuities having alternating recesses and peaks. A stereolithographic part is first substantially covered with a substance capable of becoming less viscous when heated at a temperature which does not substantially thermally degrade the part, wherein the heated substance has an appropriate surface tension. Then, the substance is heated to that temperature until the substance flows preferentially into the recesses of the surface discontinuities and away from the peaked surface discontinuities. The substance will thereafter form a short surface connection over the recesses of the discontinuities through the surface tension of the heated substance. The substance is then polymerized or hardened either by cooling, thermally setting or by UV curing.

20 Claims, 4 Drawing Sheets

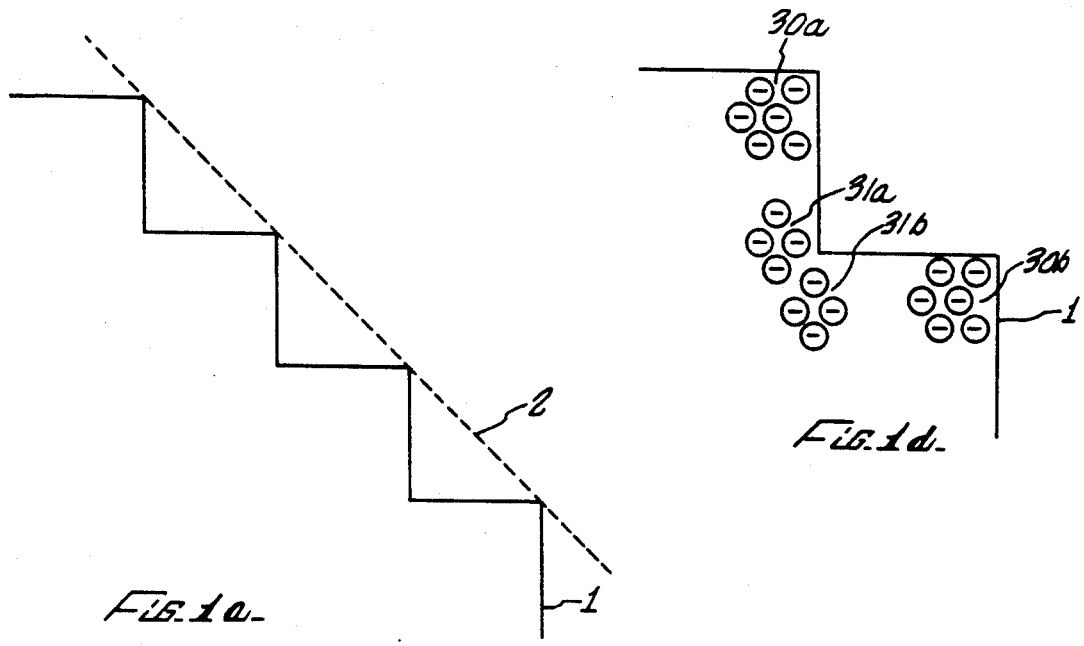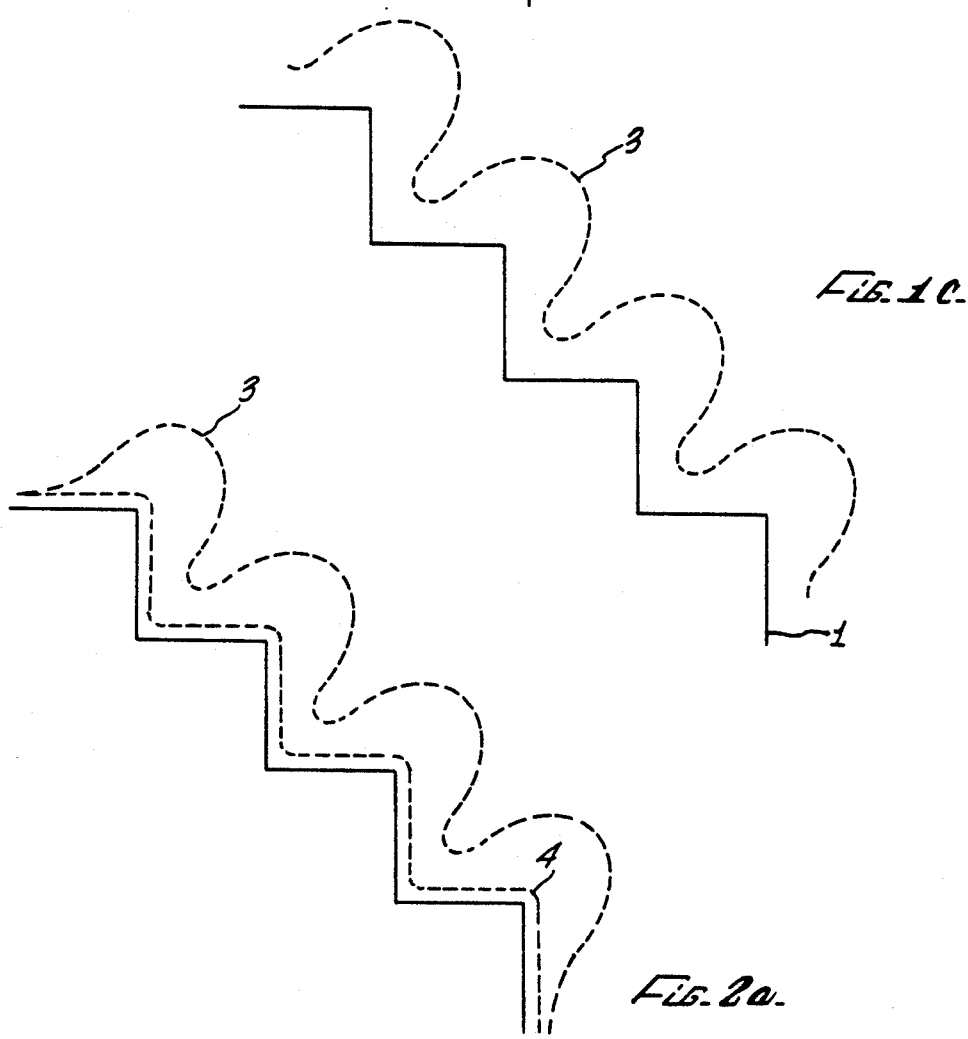

METHODS OF COATING STEREOLITHOGRAPHIC PARTS

This is a continuation of co-pending application Ser. No. 07/415,168, filed on Sep. 29, 1989, now abandoned.

BACKGROUND OF THE INVENTION

Field of the Invention

This invention relates generally to the field of stereolithography, and more specifically, to methods for coating the surface of a stereolithographic part.

Background

Stereolithography is a process for building up a reproduction of an object layer by layer such that the layers are sequentially formed on top of one another until the overall reproduction is complete. The stereolithographic reproduction is commonly referred to as a stereolithographic part, or more simply, part. The process is described in more detail in U.S. Pat. No. 4,575,330, entitled "APPARATUS FOR PRODUCTION OF THREE-DIMENSIONAL OBJECTS BY STEREOLITHOGRAPHY," by Charles W. Hull, which issued Mar. 11, 1986, and which is hereby fully incorporated by reference herein as though set forth in full. As described in U.S. Pat. No. 4,575,330, a stereolithographic apparatus ("SLA") is an apparatus for reproducing an object through the process of stereolithography. One embodiment of an SLA comprises synergistic stimulating means such as a UV laser beam or the like, photocurable liquid resin, and elevator means. The SLA forms each layer of a part by tracing the layer on the surface of the liquid resin with the UV laser beam at an exposure sufficient to cure the liquid resin to a predetermined thickness beyond the surface.

The elevator means supports the part as it is being built up, with the first layer adhering to and being supported by cured resin in the shape of webs or the like, known as supports, which supports, in turn, directly adhere to the elevator means. Subsequently formed layers are then stacked on top of the first layer. As the part is being built up, the elevator means progressively lowers itself into the liquid resin. At each step of the way, after a layer has been formed, the elevator means lowers that layer (along with all the other formed layers) into the liquid resin so that fresh liquid resin that will be used to form the next layer flows over the previous layers. Typically, the elevator means is lowered into the liquid resin by more than the desired thickness of the next layer so that the liquid resin will flow over the previous layer rapidly. Then, the elevator means is raised to the desired depth (thickness of the next layer) below the surface so that when the next layer is cured, it will adhere to the previous layer.

For further details on stereolithography, reference is made to U.S. Pat. No. 4,575,330 and the following pending U.S. and international patent applications which are incorporated herein by reference in their entirety, including appendices attached thereto or material incorporated therein by reference, as if fully set forth:

U.S patent application Ser. No. 339,246, filed Apr. 17, 1989, entitled "STEREOLITHOGRAPHIC CURL REDUCTION";

U.S. patent application Ser. No. 331,664, filed Mar. 31, 1989, entitled "METHOD AND APPARATUS FOR PRODUCTION OF HIGH RESOLUTION THREE-DIMENSIONAL OBJECTS BY STEREOLITHOGRAPHY";

U.S. patent application Ser. No. 183,015, filed Apr. 18, 1988, entitled "METHOD AND APPARATUS FOR PRODUCTION OF THREE-DIMENSIONAL OBJECTS BY STEREOLITHOGRAPHY";

U.S. patent application Ser. No. 182,801, filed Apr. 18, 1988, entitled "METHOD AND APPARATUS FOR PRODUCTION OF THREE-DIMENSIONAL OBJECTS BY STEREOLITHOGRAPHY";

U.S. patent application Ser. No. 268,429, filed Nov. 8, 1988, entitled "METHOD FOR CURING PARTIALLY POLYMERIZED PARTS";

U.S. patent application Ser. No. 268,428, filed Nov. 8, 1988, entitled "METHOD FOR FINISHING PARTIALLY POLYMERIZED PARTS";

U.S. patent application Ser. No. 268,408, filed Nov. 8, 1988, entitled "METHOD FOR DRAINING PARTIALLY POLYMERIZED PARTS";

U.S. patent application Ser. No. 268,816, filed Nov. 8, 1988, entitled "APPARATUS AND METHOD FOR PROFILING A BEAM";

U.S. patent application Ser. No. 268,907, filed Nov. 8, 1988, entitled "APPARATUS AND METHOD FOR CORRECTING FOR DRIFT IN PRODUCTION OF OBJECTS BY STEREOLITHOGRAPHY";

U.S. patent application Ser. No. 268,837, filed Nov. 8, 1988, entitled "APPARATUS AND METHOD FOR CALIBRATING AND NORMALIZING A STEREOLITHOGRAPHIC APPARATUS";

U.S. patent application Ser. No. 249,399, filed Sep. 26, 1988, entitled "METHOD AND APPARATUS FOR PRODUCTION OF THREE-DIMENSIONAL OBJECTS BY STEREOLITHOGRAPHY";

U.S. patent application Ser. No. 365,444, filed Jun. 12, 1989, entitled "INTEGRATED STEREOLITHOGRAPHY"; and International patent application, filed Sep. 26, 1989, entitled "RECOATING OF STEREOLITHOGRAPHIC LAYERS," PCT filing No. U.S./89/04096.

This layer by layer build up of the part results in the surface of the part having a stairstep appearance. This is illustrated in FIG. 1a, which is a diagram of a side view of the surface of such a part, with the stairstep aspect of the surface identified with reference numeral 1. FIG. 1b is a side view of a cross-section of an actual stereolithographic part, with the stairstep aspect identified with reference numeral 6.

The stairstep appearance of a stereolithographic part, in turn, stems from each layer of the part having a finite thickness, where the height of each step of the stairstep is equal to the layer thickness. This stairstep surface, however, is a significant source of inaccuracy of the part, since this surface is introduced by stereolithography itself, and is not typically present in the object being reproduced. This is illustrated in FIG. 1a where the surface of the object being reproduced may be represented with dotted line 2. As is apparent, the surface of the part is quite different from the surface of the object.

Although it may be theoretically possible to correct for the stairstep appearance by decreasing the layer thickness (and necessarily creating more layers) until it is infinitesimally small, with certain resin formulations, layer thicknesses smaller than about 5 mils are not possible. Even if smaller layer thicknesses than this were possible, part building would generally take much longer because of the multiplicity of layers which must be formed. Therefore, smaller layer thickness may not be a practical solution to the stairstep appearance.

One approach which has been explored to eliminate this characteristic roughness of surface finish has been to build an oversized reproduction of an object which is then sanded down so that it accurately represents the object. This approach is described in more detail in co-pending U.S. patent application Ser. No. 331,644, referenced earlier. A problem with this approach, however, is that it may not be effective for accurately reproducing complex objects having difficult to reach surfaces, since these surfaces cannot be easily reached for sanding. An additional problem is that sanding may adversely affect the surface quality and the translucence of the surface.

Accordingly, it is an object of the present invention to provide methods for coating the surface of a stereolithographic part which does not substantially damage the part, and which adequately smooths out characteristic stereolithographic surface discontinuities without substantially affecting part accuracy.

SUMMARY OF THE INVENTION

To achieve the foregoing objects, and in accordance with the purpose of the invention as embodied and broadly described herein, there is provided a method for coating a stereolithographic part having characteristic surface discontinuities made up of alternating recesses and peaks comprising the steps of substantially covering the part surface with a substance capable of becoming less viscous upon heating to a temperature which does not substantially thermally damage the part, the heated substance having an appropriate surface tension; heating the substance at the temperature until the substance becomes less viscous and preferentially flows into the recesses of the surface discontinuities and away from the peaks, thereafter forming a short surface connection across the recesses of the discontinuities through the surface tension of the heated substance; and solidifying the substance.

BRIEF DESCRIPTION OF THE DRAWINGS

FIGS 1a and 1b illustrate the characteristic stairstep surface discontinuities of a typical stereolithographic part;

FIG. 1c illustrates the initial distribution of powder particles on the surface of FIG. 1a in a powder coating embodiment of the subject invention;

FIG. 1d illustrates the distribution of charge on a stereolithographic part surface which results in the powder distribution of FIG. 1c;

FIG. 2a illustrates the action of coating surface discontinuities without significant surface tension influence;

DESCRIPTION OF THE PREFERRED EMBODIMENTS

In a first embodiment of the subject invention, coating is achieved through electrostatic powder coating. According to this embodiment, plastic powder particles are charged and sprayed onto the part, which is charged to the opposite polarity of the particles, or grounded. The particles are thereby attracted to the surface of the part. The part (and particles) are then typically thermally heated, whereupon the particles melt. Continued application of heat raises the temperature, causing the melted particles to form a liquid that can flow under the force of surface tension (if the force is high enough and viscosity low enough). Additional increases in temperature can cause certain coating materials to harden, and cure.

Figure 1B:
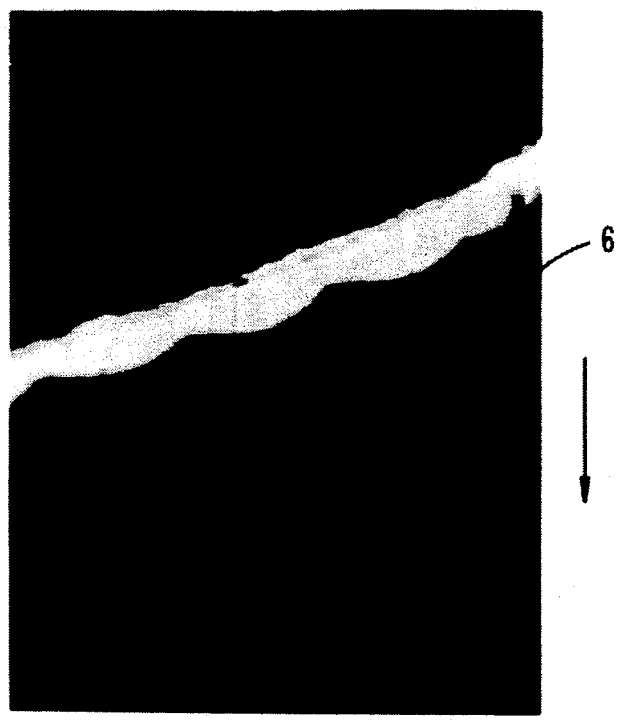

Electrostatic powder coating, however, is beset with several problems when applied to stereolithographic parts, and a key aspect of the subject invention is the recognition of, and the overcoming of, these problems. First, there may be broad separation between the temperature at which certain powder particles melt, and the temperature at which they cure. For these powders, the cure temperature may be so high that the stereolithographic part which is to be coated may thermally degrade at this temperature. As a result, with these powders, it is difficult to fully cure the melted powder without damaging the part. Second, with certain powders, it may be difficult to make the part conductive enough to attract a sufficient volume of powder particles to the part. Attempts to make stereolithographic parts conductive, by mixing metal particles into the resin used to make the part, have not always been successful because the resin tends to encapsulate such particles, thereby limiting their conductive impact. Third, as discussed earlier, it may not be possible to reduce the layer thickness, and hence the stairstep discontinuity, by more than about 5 mils. It may be difficult to smooth over these discontinuities through electrostatic powder coating, particularly since, as illustrated in FIG. 1c, the powder particles will tend to distribute themselves initially non-uniformly over the part away from the very surface discontinuities they are intended to smooth out. Means must be provided for distributing the powder particles over the discontinuities.

As illustrated in FIG. 1c, the initial distribution of powder particles is identified with reference numerical 3. As indicated, the particles will tend to accumulate around the points of the stairstep and away from the valleys. This is because the accumulation of charge is proportional to the surface charge density, which is greatest at the points. The surface charge density in the valleys is low, unlike at the points, therefore, the charge will accumulate to a much lesser degree since charges from adjacent stairsteps will repel each other in these areas, thereby reducing the accumulation of charge. In FIG. 1d, the surface charge density (negative for purposes of illustration only) at the peaks of adjacent stairsteps is identified with reference numerals 30a and 30b, respectively. The charges that accumulate in the valley from adjacent stairsteps are identified with reference numerals 31a and 31b, respectively. As illustrated, these charges will repel each other. In sum, the charges will accumulate away from the valley discontinuities they are intended to smooth over.

Additional coats are not always a solution to the above-mentioned problem since additional coats may destroy the accuracy of the overall surface. In addition, with certain powders, additional coats may not even be possible.

These and other problems are solved by the method of the subject invention.

Figure 3:
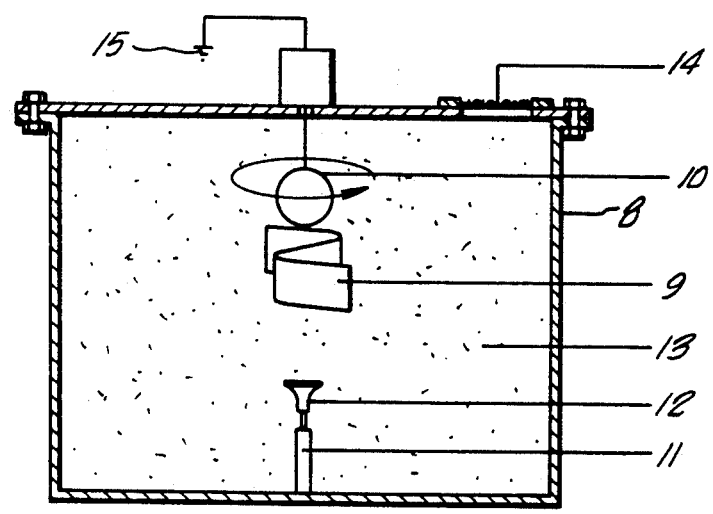
FIG. 3 is a diagram of an apparatus for electrostatic powder coating of stereolithographic parts.

An apparatus for performing electrostatic powder coating on stereolithographic parts is illustrated in FIG. 3. As illustrated, the apparatus comprises a closed chamber 8 in which is placed a part 9. As illustrated, the part is tied to ground (identified by reference number 15 in the Figure). Alternatively, the part could be charged to an opposite polarity of the charged particles (see below). The apparatus also comprises electrostatic gun 11, and electrostatic generator 12. The electrostatic gun sprays a stream of particles past the electrostatic generator, whereupon the particles become charged. The charged particles then circulate around the interior of the chamber as indicated by reference number 13 in the Figure to create an environment saturated with charged particles. The part is advantageously slowly rotated by rotation means 10 at about 10 RPM to help expose it to the charged particles. Also shown is filter 14 which allows air to escape while keeping the charged particles within the closed chamber.

The part should be made as conductive as possible, which can be accomplished by immersing it in a low humidity, conductive solution such as E.C.C. #519, and then letting it dry. Coating the part with such a solution will cause it to absorb moisture from the atmosphere until the part has achieved an adequate level of conductivity.

The powders which can be used are from the families of powders used to coat metal surfaces. These powders typically have a particle diameter in the range of about 30-35 microns. For coating stereolithographic parts, however, the particle size may advantageously be increased to about 50-60 microns. This allows higher accumulation of mass. Low-temperature polyester, epoxy, or hybrid polyester/epoxy powders are possible, including: 1) thermoplastics; and 2) thermosets. Thermoplastics, when heated, will melt, and will then harden when cooled at a sufficient temperature. Once hardened, they will remelt if heated again. Thermosets are powders which melt when heated, but if additional heat is applied, they will cross-link and harden. Thereafter, further heating will not melt thermosets. Several examples of possible powders include PROTECT White or Black, FERRO Clear, INTERNATIONAL White or Black, H.B. FULLER Black, or TIGER 89. Other examples are possible, and the above is not meant to be limiting.

Examples of electrostatic guns include a corona gun manufactured by VOLTSTATIC or BINKS. Alternatively, a tribo gun manufactured by RUNSBURG-GAMA is also possible.

For the corona gun, a small part is typically exposed to the charged particles for about 1½ minutes, while a larger part is typically exposed for about 10 minutes. In either case, the part is advantageously rotated while it is so exposed since the corona gun sprays the particles in random directions and does not provide a directed spray. As a result, rotating the part helps ensure that it picks up a sufficient quantity of charged particles to coat it adequately.

For the tribo gun, the part has less need to be rotated since the gun provides a directed spray, which can be aimed directly at regions of the part that are to be coated. For a small part, typically 10-15 seconds exposure is sufficient, while even more exposure is typically provided for larger parts.

It has been found that the directed spray from the tribo gun is advantageous for coating a stereolithographic part. This is because the directed spray from such a gun helps ensure that a sufficient volume of particles will coat the part from the combination of attraction and bombardment. The corona gun has a voltage setting, which is typically set to about 12-15 kv.

The use of powders having a larger particle diameter than is typically used to coat metal part surfaces is also advantageous. As discussed above, powder particles for metal surfaces typically range in diameter between 30-35 microns, while diameters in the range of 50-60 microns may be better for stereolithographic part surfaces. The larger diameter particles also helps ensure that a sufficient volume of powder is delivered to the part surface to adequately coat it.

After the powder has been delivered to the surface, it should be melted into a liquid for flowing into and smoothing over the surface discontinuities.

A significant aspect of the subject invention is the recognition that the surface tension in the melted powder will cause the liquid to smooth over stereolithographic surface discontinuities, instead of just forming a uniform layer over the surface, even though the particles are initially distributed away from the valley discontinuities. The surface tension in the liquid will cause liquid placed adjacent to or in a surface discontinuity to form a short surface connection across the discontinuity.

Based on the teachings herein, one of ordinary skill would be able to select a powder that has the desired surface tension properties to be used effectively with a particular stereolithographic resin. The cohesive forces of the coating, as reflected in its surface tension, should be strong enough to smooth out the discontinuities. These cohesive forces must also be matched with the adhesive forces between the post-cured stereolithography resin and the coating material so that the two materials will stay in contact with each other and so that the surface tension will smooth out the discontinuities. The result is a non-uniform coating over the surface which smooths over the discontinuities.

Figure 2C:
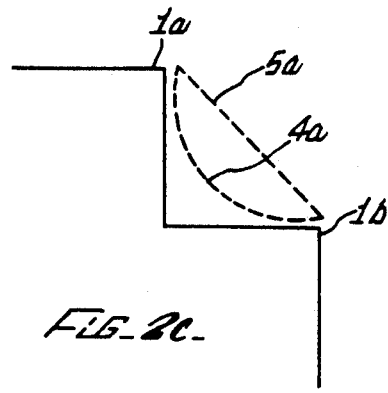
FIG. 2c illustrates the impact of surface tension on a single one of the stairsteps of FIG. 2b.
Figure 2B:
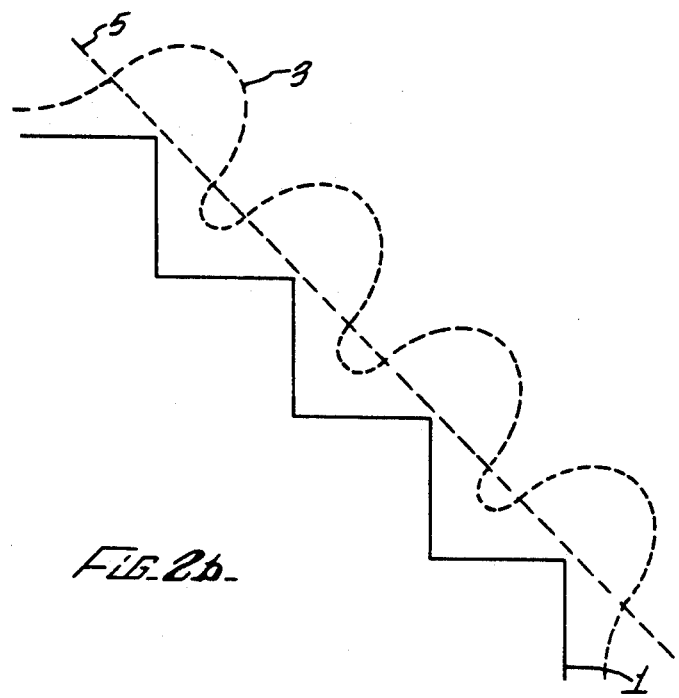
FIG. 2b illustrates the impact of surface tension in smoothing surface stairstep discontinuities.

Turning to FIGS. 2a-2c, in which compared to previous figures, like elements are identified which like reference numerals, the impact of surface tension is illustrated. FIG. 2a illustrates the coating that would result in the absence of surface tension. Part surface 1 is shown with a initial distribution of power particles identified which reference numeral 3. After melting, the distribution of the melted powder, in the absence of surface tension, is identified with reference numeral 4. As shown, the liquid is shown distributed over the part surface in a relatively uniform layer.

FIG. 2b illustrates the impact of surface tension. The surface tension of the liquid will lead to the distribution identified with reference numeral 5. As shown, the distribution adequately smooths the stairstep surface discontinuities precisely because the surface tension causes the liquid to distribute itself non-uniformly over the part surface.

The action of the surface tension is illustrated in FIG. 2c, which focuses on just one of the stairsteps of FIG. 2b. As indicated earlier, surface tension will cause the liquid adjacent to or in a discontinuity to distribute itself over the discontinuity with a short surface connection, thereby reducing surface area. In FIG. 2c, for example, surface tension will cause the liquid to distribute itself between points 1a and 1b of the discontinuity to achieve the surface connection identified which reference numerical 5a rather than that of 4a.

To melt the powder, the powder must typically be heated to about 80–85 degrees C. Since most stereolithographic parts will not thermally degrade until heated to at least about 120 degrees C., and possibly 140 degrees C., the melting of the powder should not thermally degrade the part at all. After the powder is melted, it will then flow into and bridge the surface discontinuities in the manner described earlier.

Additional heating of a melted thermoset powder may be necessary to first gel and then completely cure the melted powder. This is because these powders are plastic powders containing monomers, and complete curing of the powder will typically require cross-linking of the monomers, by which the physical and chemical properties of the powders change. Complete cross-linking (and complete curing) typically requires heating the liquid to about 160°–220 degrees C. on average, and possibly to as low as 145 degrees C. Since certain stereolithographic plastics will thermally degrade at about 120 degrees C., and possibly as high as about 140 degrees C., completely cross-linking the coating may thermally degrade the part. However, partial cross-linking will take place at temperatures below this. Therefore, it may be possible to sufficiently cross-link certain thermoset powders without thermally degrading the part.

In fact, it has been found that with these powders, that heating the part, after it has been coated, for more than about 20 minutes, and preferably for about 25 minutes, in a conventional convection oven, at a temperature less than about 110 degrees C., and preferably about 105 to 110 degrees C., will be sufficient to adequately allow the powder to flow over surface discontinuities, and then harden. Alternatively, thermoplastics will harden without any additional heating or cross-linking.

It will be appreciated by one of ordinary skill, from the teachings herein, that other stereolithographic resin formulations are possible that can withstand higher temperatures, and that will not thermally degrade at the temperatures described above required to completely cross-link the thermoset powders. One of ordinary skill would also appreciate that other thermal powder formulations are possible that will completely cross-link at lower temperatures than described above, or that will cross-link when subjected to UV radiation. In fact, UV curable powder formulations are possible simply by adding photo-initiator to traditional powder formulations, which will provide a mechanism for the melted powder to polymerize when subjected to UV radiation as opposed to just heat. In addition, thermal initiators could be added to a thermoset powder to lower the temperature at which the powder will completely cross-link. It has been found that the temperature at which certain plastics will polymerize can be lowered to about 60–70 degrees C. through the addition of a thermal initiator. Care should be taken, however, to ensure that the cross-linking temperature is not lowered too much, so that the plastic begins curing close to the temperature it melts. If these temperatures are too close, the melted powder may begin cross-linking before it is able to flow into and smooth over the surface discontinuities. In fact, thermoplastics, because they do not cross-link at all, will never have this problem, thus, they may be superior in certain applications compared to thermosets.

The above embodiment of the subject invention may also be important since it is substantially independent of the orientation of the part which is being coated. This is because the mechanism by which coating occurs is dominated by surface tension of the liquid, and not gravity. Therefore, the surface tension will act to provide a smooth coating independent of the direction of the force of gravity. For coatings of materials, or thicknesses of coatings, whose surface tension is not great enough to ignore gravity, different regions of the object can be coated, melted, and set separately.

Figure 4A:
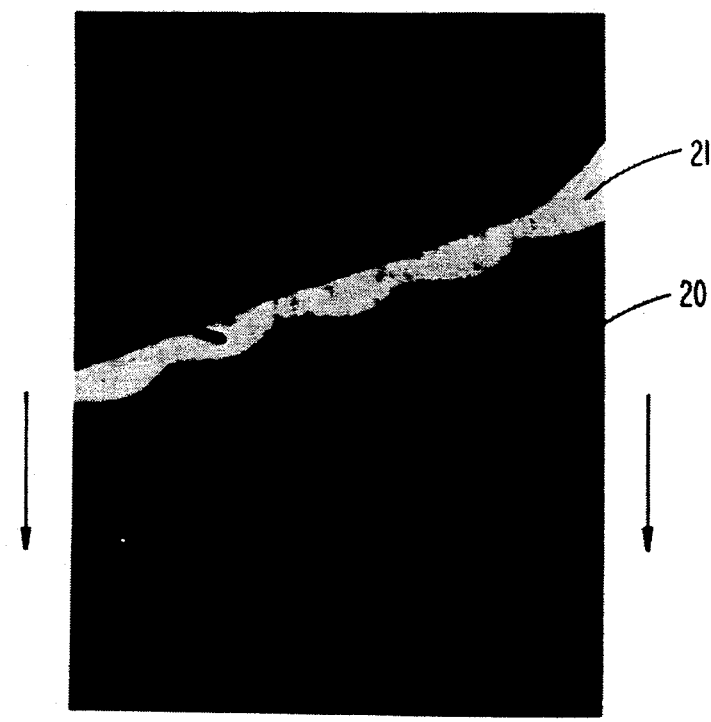
FIG. 4a illustrates powder coating of a stereolithographic part with the part surface at a slant with respect to the horizontal.
Figure 4B:
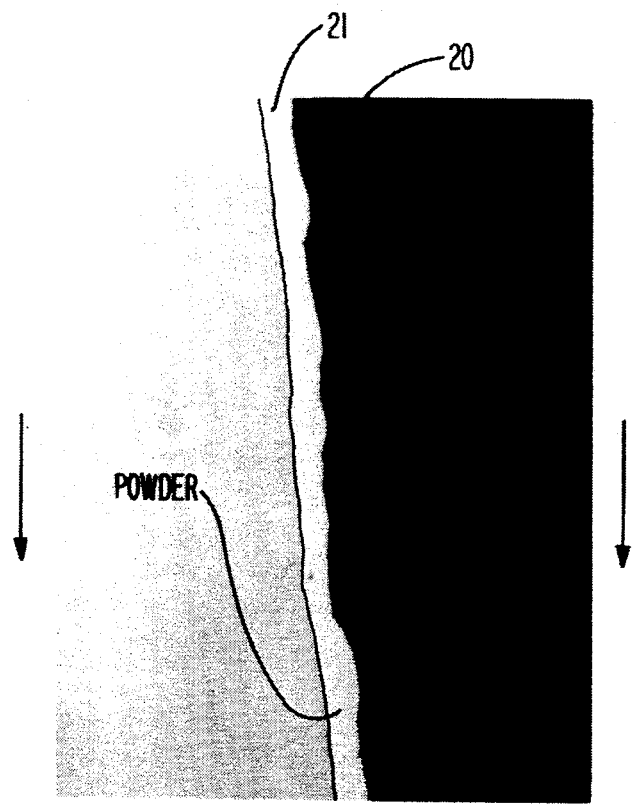
FIG. 4b illustrates powder coating of a stereolithographic part with the part surface oriented substantially vertically.
Figure 4C:
FIG. 4c illustrates powder coating of a stereolithographic part with the part surface oriented substantially horizontally.

FIGS. 4a–4c illustrate powder coating a part at different orientations. In each of these figures, a cross-section of the part is identified with reference numeral 20, while the powder coating is identified with reference numeral 21. FIG. 4a shows the part surface at a slant with respect to the horizontal, FIG. 4b shows the part surface oriented substantially vertically, and FIG. 4c shows the part surface oriented substantially horizontally. In each instance, the powder coating adequately smooths over the surface discontinuities.

Figure 5:
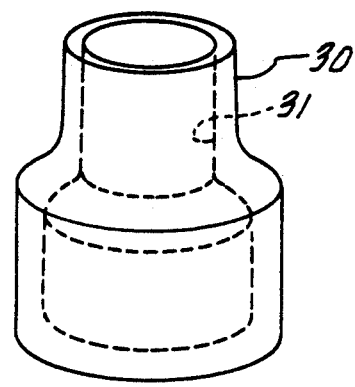
FIG. 5 illustrates a part having an enclosed interior surface.

It may be difficult to deliver an adequate volume of particles to hard-to-reach surfaces of complex parts, such as an internal surface of an enclosed cavity, for example. In this instance, selective charging or grounding of the part surface could be beneficial in achieving a better distribution of particles. For example, turning to FIG. 5, which illustrates a part having an enclosed cavity, exterior surface 30 alone could be grounded or charged initially, and then sprayed with particles. Then, interior surface 31 alone could be grounded or charged, and then sprayed with particles. As a result, a better distribution of particles over the surface would result compared to when both surfaces are grounded or charged, and then sprayed simultaneously.

Additional details about electrostatic powder coating are available "User's Guide to POWDER COATING", prepared by AFP/SME Powder Coating Division, edited by Emery Miller, and published by the Association for Finishing Processes of the Society of Mechanical Engineers, Publications Development Department, Marketing Division, One SME Drive, Post Office Box 930, Dearborn, Mich. 48121, including the references cited on p. 159 therein, which are as follows:

1. "Plant Design for Efficiency," B. Makin, University of Dundee (U.K.)
2. "Troubleshooting on Powder Installations," Doctor J. F. Hughes, University of Southampton (U.K.)
3. "The Electrical Charge of the Powders," Dr. Armando Begongno (Italy)
4. "Fundamentals of Powder Coating," Drs. Emery P. Miller and David D. Taft, SME Publications
5. "Safety and Health Aspects of Powder Coating," Bob Keown, Nordson Corporation
6. "Powder Coating: The U.S. Appliance Industry," Bob Keown, Nordson Corporation 7. "Powder Coating: The Total System Concept," Bob Keown, Nordson Corporation
8. "Regular Maintenance Sharpens Powder Coating Efficiency," Bob Keown, Nordson Corporation
9. "Laying Waste", Michael Brown, Pantheon Books
10. "Hazardous Waste in America," Samuel Epstein, Lester Brown and Carl Pope, Sierra Club Books
12. "Why Powder Coating," Donald Tyler and Bruce Bryan, Volstatic, Incorporated, all of which are incorporated by reference herein as if fully set forth.

Another embodiment of the subject invention will now be described, where a radiation curable liquid or paint is used to coat the part surface instead of a powder. According to this embodiment, a part is dipped into or sprayed with a radiation curable liquid, which thereafter bridges over the surface discontinuities through the action of surface tension in a manner similar to that described earlier with respect to powders. The radiation curable liquid in a preferred embodiment is UV curable. In this preferred embodiment, the liquid is cured by shining UV light onto it at a sufficient intensity to cure the liquid. In addition, thermally curable liquids are possible.

Compared to the powder embodiment, the advantages of this embodiment are that the liquid can be initially applied to the part surface through dipping or spraying, without requiring any electrostatic charging. In this way, it is easier to obtain adequate coatings. There may be less difficulty in matching required cohesive and adhesive characteristics. Also, the use of UV curing allows the coating and curing of parts or regions of parts in multiple steps. Another advantage, compared to powders which may require thermal curing, is that the liquid is UV curable, and hence, can be cured without any chance of thermally degrading the part. A third advantage is that the formulations of suitable liquids may be very similar to the resin used to build the part in the first instance. Therefore, suitable UV curable liquids may be easier to formulate than suitable powders. In fact, a suitable liquid is possible to formulate simply by adding a solvent (that will evaporate) to a high molecular weight UV curable resin. The liquid is then applied to a part through spraying or dipping, and then heated to speed up evaporation of solvent along with the flow of the liquid. The action of the surface tension will then cause the liquid to bridge over surface discontinuities in a manner similar to that described above. Meanwhile, the solvent will have completely evaporated out of the liquid. Then, the part could be subjected to UV radiation which would fully cure the coating liquid. In addition, since the liquids will not cross-link when heated, they will not have the problem described earlier of certain thermoset powders, which may cross-link close to the temperature at which they melt.

Additional advantages of this embodiment are that such a liquid may be more effective in coating hard-to-reach surfaces of complex parts then a powder. In addition, a liquid coating can provide an effective way to make a stereolithographic part conductive. Silver platelets may be put into the UV curable liquid to make the liquid conductive. When the liquid is used to coat the part, the part can be made conductive. It has been found that silver platelets do not suffer from the encapsulation problem mentioned earlier with respect to other metal particles.

By making the part conductive, the part can then be electrostatically powder coated or coated with electrophoresis if additional coats are desired. Electrophoresis is the process whereby the part is immersed into a liquid bath containing charged particles that are attracted to the part by oppositely charging the part or grounding it. The particles are then made to flow by similar methods to those already described. In addition, through selective coating of areas with a conductive coating, stereolithography can now be used to make three dimensional prototypes of circuit boards.

EXAMPLE

As an example of the above embodiment, a UV curable liquid was prepared as follows:
50 g UVITHANE UV 783 (flexible acrylated urethane)
25 g toluene (solvent)
35 g ethanol (solvent)
10 g methylene chloride (solvent)
2 g IRGGACURE 184 (photoinitiator)
0.3 g FC 431 (flow control agent)

A thin layer of the above liquid was sprayed onto a test part having a 10 mil layer thickness. (Alternatively, the liquid could have been applied through air brushing or dipping.) The part was then placed in an oven for about 5 minutes at about 100° C. Since the coating at this point appeared noncontinuous, a second application of the liquid was sprayed onto the part, and the part again heated in the oven for about 5 minutes at about 100° C. At this point, the part appeared to have a very smooth surface finish. The part was then placed onto a post-curing apparatus (PCA) for UV curing, and cured for about 10 minutes to harden the coating. (Post-curing is described in more detail in U.S. patent application Ser. No. 268,429, referenced earlier.) The test part was then cross-sectioned, and the coating thickness was measured as being between about 0.006 and 0.007 inch.

The above example illustrates the possibility of multiple applications of the liquid before UV curing in order to achieve a more continuous coating than obtained with just one application. Alternatively, coating followed by UV curing followed by coating, etc., could also have been used. Multiple applications may be necessary in those instances where a very viscous substance such as UVITHANE 783 is used in the coating. UVITHANE 783 is immobile at room temperature. If other, less viscous substances are used in the liquid, or if coating is performed at elevated temperatures above room temperature, multiple applications may not be necessary.

An additional advantage illustrated by the above example is that before UV curing, if the finish is not acceptable, the coating can be stripped off with solvent, and another coat applied until an acceptable finish has been achieved. At this point, the part could be UV cured.

In general, a suitable liquid has four generic components: a photocurable resin component, a volatile solvent component, a photoinitiator component, and a flow control agent. Typically, the resin component will comprise about 10–50% of the overall liquid, the solvent 45–85%, the photoinitiator, typically 1–5%, and the flow control agent, typically about 0.1% or less. The percentage of the solvent in an actual application will depend on the resin viscosity, the method of applying the liquid (spraying or dipping), and the amount of time the liquid will be heated.

The solvent should be volatile so it will begin evaporating right after spraying or dipping. After the liquid is applied to the part in an initial application step, the part could be allowed to sit before heating to give the solvent a chance to evaporate. Alternatively, the part could be first heated gently to give the solvent a chance to evaporate. Compared to allowing the solvent to evaporate simultaneously with heating the liquid, the above approach has the advantage of providing better control of the liquid flow. If the liquid is heated too soon, before the solvent has evaporated, the liquid may run off the part. By allowing the solvent to evaporate first, the composition of the liquid at the surface will be fixed during heating, resulting in better control. A suitable solvent can be determined for a given application based on the known art for formulating solvent for paints. For example, as with paints, to achieve a better surface finish, it may be advantageous to add a first minor solvent which evaporates slowly, and a second major solvent which evaporates rapidly.

Before the solvent has evaporated, the liquid may run off certain areas of the part due to gravity. If this occurs, the part could be coated in steps, and reoriented at each step so that gravity will not cause the liquid to run off the area being coated.

The temperature at which the liquid should be heated depends on the viscosity of the resin. The viscosity of the resin, in turn, should be thick so that a sufficiently thick coating can be applied to a part without it running off the surface, or so that multiple coats can be applied.

The temperature should be well above room temperature to provide control over the liquid flow. If the temperature is too low, no control is provided. Typically, the temperature will be at about 60 degrees C. or more.

The temperature should not exceed about 120 degrees C. with certain resins because of the possible thermal degradation effects. Therefore, the most useful temperature range will be about 60-120 degrees C.

The flow control agent acts to reduce the surface tension of the liquid so it will give better surface wetting, and more even coating.

The time at which the liquid is heated will depend on the temperature, and the resin viscosity. Typically, 1-30 minutes will be sufficient. UV curing will typically occur within about 2-10 minutes.

Other liquids are possible. For example, a thixotrophic liquid or paint, whose viscosity will lower when subjected to sheering stress, is possible. The liquid could be sprayed on the part, and the sheering stress of the spraying may lower the viscosity sufficiently to allow it to be sprayed and coat the part without running off the part. Then, the liquid could be heated to help it flow, and thereafter cooled to solidification, thermally or UV cured, as described above. If a thermoplastic is used, the part would be at an elevated temperature during coating as well as flowing, then the part would be cooled to room temperature to yield a smoothly coated part.

The subject invention provides coating methods which can easily be integrated into an SLA to provide a device which, automatically, under control of a control computer, first builds a stereolithographic part and then applies a coating to the part, resulting in a finished prototype with a smooth surface without requiring manual intervention. Co-pending "INTEGRATED STEREOLITHOGRAPHY," referenced earlier, describes integrating other stereolithographic functions, such as part cleaning and post-curing, into the SLA, by adding other chambers to the SLA vat in which these functions are to be performed, or by providing means such as a hinged shutter to isolate different areas of a single chamber vat where these functions are to be performed. One of ordinary skill in the art would appreciate that a part coating step, employing concepts of the subject invention, could also be integrated into the SLA by adding another chamber to the vat where coating would be performed, and by adding means to move the part amongst the various chambers. Alternatively, a single chamber vat could be provided with means such as a shutter for isolating an area in a single vat where part coating could be performed.

The subject invention is also important in the field of investment casting a/k/a the "lost wax" process. According to this process, common in the manufacture of jewelry, for example, a master prototype is made out of wax, which is then used to make a production mold for the manufacture of replicas. To form the mold, the wax prototype is placed into a mold forming substance such as liquid epoxy, plaster, or the like, which then hardens around the wax to form a block with drainage holes that run from the prototype to the exterior of the block.

The block is then placed into an oven and heated, whereupon the wax melts, and is drained out of the hardened mold forming substance through the drainage holes to leave a mold for production. The mold forming substance is chosen so that it is resistant to high temperature. This is so that when the substance is heated, it will not thermally degrade. In fact, many molds cure when heated to such temperatures.

As an alternative to forming a wax prototype, a stereolithographically-formed prototype can also be used to make a production mold in the manner described above: placing the prototype in a mold forming substance which hardens around it with drainage holes to the outside, and then heating the substance until the prototype burns away, or is incinerated, and falls out through the drainage holes. A problem with this approach, however, is that heating the stereolithographic prototype may cause it to swell slightly, which in turn, may cause the block to break. To counteract this problem, the prototype could be built undersized, and then coated according to a method of the subject invention with a powder or liquid having a lower melting temperature than the plastic used to form the prototype. The coating should also be at least as thick as the swelling of the prototype. Then, the coated prototype would be placed in the liquid mold forming substance which would harden around the prototype in the manner described above. After the substance has hardened around the prototype, the block would be heated in stages. In the first stage, the block would be heated at a low enough temperature so that the prototype would not swell, but high enough so that the coating would melt and drain off through the drainage holes leaving a space. In the second stage, the block would be heated at a high enough temperature to burn off the prototype. Any swelling of the prototype would expand into the space left by the coating and not break the block.

As another example, the prototype could be coated with wax instead of a plastic coating to leave a space for swelling of the prototype, and the wax melted off in the first stage. As before, the prototype could be burned off in the second stage. Wax would be applied and flowed, and then hardened in a manner similar to thermoplastics.

As is apparent from the aforementioned description, the subject invention provides methods for coating stereolithographic parts having surface discontinuities which do not substantially damage the part, and which smooth over the discontinuities without substantially affecting part accuracy. To obtain a desired level of high accuracy in combination with the use of a coating to fill in discontinuities, one would offset the walls of the part before building the part to compensate for a known coating thickness that will be applied later. Use of similar techniques to compensate for laser beam width are described in U.S. patent application Ser. No. 311,664, reference earlier.

Additional benefits are that the methods are inexpensive and efficient, since excess powder particles or UV curable liquids can be collected and reused, if they are sprayed towards but ultimately not used to coat the part in a particular application. In addition, powders are available which are non-toxic, and therefore have little or no environmental conflict. An additional benefit, particularly for stereolithographic parts, is that the only equipment needed for powder coating is a self-contained booth for spraying the powder towards the part, without requiring any exhaust to the outside. As a result, this equipment may be easily intergradable into an SLA. Methods of coating with liquids are also beneficial is that the liquids can be applied to the part through spraying or dipping, and electrostatic charging is not required. In addition, UV curable liquids are available simply by adding solvents and photoinitiator to existing resins used to build parts. UV curable powders are available by adding photoinitiators to existing thermoset type powders. In addition, thermosets which cure at lower temperatures are possible by adding thermal initiator to existing thermosets. To one skilled in the art, these techniques are applicable to any layer-by-layer approach for building three-dimensional pats other than by stereolithography.

Additional advantages and modifications will readily occur to those skilled in the art. The invention in its broader aspects is not, therefore, limited to the specific details, representative methods, and illustrative examples shown and described. Accordingly, departure may be made from such details without departing from the spirit or scope of applicant's general inventive concept.

What is claimed is:

1. In a stereolithographic method for forming a part from a material capable of selective physical transformation upon exposure to prescribed synergistic stimulation including forming successive cross-sectional patterns of the part on a selected surface of the material capable of selective physical transformation, relatively displacing the selected surface and said cross-sections as they are formed, and building up the part layer by layer in a step-wise fashion, wherein the part has surface discontinuities between at least some adjacent layers, the improvement comprising the following steps:

electrostatically coating at least a surface of the part with powder particles which melt at a temperature in the range of about 60–120 degrees Centigrade into a melted powder having an appropriate surface tension;

heating the coated part at said temperature until the particles melt into a melted powder, which flows into surface discontinuities, and thereafter forms short surface connections across the surface discontinuities through the surface tension of the melted powder; and solidifying the melted powder to form a permanent coating which becomes a portion of the stereolithographically produced part.

2. The method of claim 1 wherein the powder is a thermoset.

3. The method of claim 1 wherein the powder is a thermoplastic.

4. The method of claim 1 wherein the powder is an epoxy.

5. The method of claim 1 wherein the powder is a polyester.

6. The method of claim 1 wherein the powder is a hybrid epoxy/polyester.

7. The method of claim 1 wherein the powder particles have a particle diameter of about at least about 50 microns.

8. The method of claim 1 wherein the powder is a UV curable powder, and the method further comprises the step of irradiating the coated part, at a time after said heating, with UV light until the melted powder cures.

9. The method of claim 1 wherein the powder is a thermoset which cross-links at a temperature below 120 degrees Centigrade, and wherein the step of solidifying the melted powder further comprises heating the coated part until the melted powder cures.

10. A method for coating a surface of a stereolithographic part having surface discontinuities between at least some adjacent layers, comprising the following steps:

applying a liquid, which is curable in response to synergistic stimulation and which is capable of becoming less viscous when heated to a temperature in the range of about 60–120 degrees Centigrade, to substantially coat a surface of the part, the less viscous liquid having an appropriate surface tension;

heating the coated part at a temperature in said range until the liquid becomes less viscous, flows into at least a portion of the surface discontinuities, and thereafter forms short surface connections across said at least portion of the surface discontinuities through the surface tension of the liquid; and irradiating the coated part with said synergistic stimulation, at a time after said heating, until the liquid cures to form a permanent coating which becomes a portion of the stereolithographic part.

11. The method of claim 10, wherein the liquid is applied by dipping the part into the liquid.

12. The method of claim 10 wherein the liquid is applied by spraying it onto the part.

13. The method of claim 10 wherein the liquid contains a volatile solvent.

14. The method of claim 10 wherein the liquid comprises about 10–50% by volume of a photocurable resin, about 45–85% by volume of a volatile solvent, about 1–5% by volume of a photoinitiator and up to about 0.1% by volume of a flow control agent.

15. An improved stereolithographic method for forming a part from a material capable of selective physical transformation upon exposure to prescribed synergistic stimulation including forming successive cross-sectional patterns of the part on a selected surface of the material capable of selective physical transformation, reactively displacing the selected surface and said cross sections as they are formed and building up the part in a step-wise fashion, wherein the part has surface discontinuities between at least some adjacent layers, the improvement comprising the steps of:

applying a substance to at least a portion of the said at least one surface of said part which is capable of becoming less viscous when heated to a temperature which does not substantially thermally degrade the part, wherein the less viscous substance has an appropriate surface tension; and heating the substance up to said temperature until the substance flows into at least some of the surface discontinuities and forms a short surface connection over the discontinuities through the surface tension of the less viscous substance; and solidifying the substance after it forms the short surface connections so that it permanently becomes a portion of the stereolithography part.

16. In a stereolithographic method for forming a part from a material capable of selective physical transformation upon exposure to prescribed synergistic stimulation including forming successive cross-sectional patterns of the part on a selected surface of the material capable of selective physical transformation, relatively displacing the selected surface and said cross-sections as they are formed and building up the part layer by layer in a step-wise fashion, wherein the part has surface discontinuities between at least some adjacent layers, the improvement comprising the steps of:

substantially coating at least a portion of the part surface with a substance which is capable of becoming less viscous when heated to a temperature which does not substantially thermally damage the part, the heated substance having an appropriate surface tension;

heating the coated part to said temperature until said substance flows into the surface discontinuities and forms short surface connections across the discontinuities through the surface tension of the heated substance; and solidifying the substance after it forms the short surface connections so that it permanently becomes a portion of the stereolithographically produced part.

17. The method of claim 16 wherein the substance is a powder.

18. The method of claim 16 wherein the substance is a liquid.

19. The method of claim 16 wherein the substance is thermally curable at a cure temperature which does not thermally degrade the part, and wherein the step of solidifying the melted powder further comprises heating the coated part at said cure temperature until the substance cures.

20. The method of claim 16 wherein the substance is UV curable, and the method further comprises the step of irradiating the coated part with UV light until the substance cures.

* * * * *